United States Patent [19]

Boland

[11] Patent Number: 4,636,972

[45] Date of Patent: Jan. 13, 1987

[54] METHOD AND APPARATUS FOR DIGITAL FILTERING

[75] Inventor: Robert P. Boland, Wilmington, Mass.

[73] Assignee: Sanders Associates, Inc., Nashua, N.H.

[21] Appl. No.: 555,261

[22] Filed: Nov. 25, 1983

[51] Int. Cl.$^4$ ............................................. G06F 15/31
[52] U.S. Cl. ..................................................... 364/724
[58] Field of Search ..................... 364/724; 375/94, 96, 375/103

[56] References Cited

U.S. PATENT DOCUMENTS

| | | | |
|---|---|---|---|
| 3,883,726 | 5/1975 | Schmidt | 364/724 |
| 4,207,624 | 6/1980 | Dentino et al. | 364/724 |
| 4,231,277 | 11/1980 | Wachi | 364/724 |
| 4,245,325 | 1/1981 | Kikvchi et al. | 364/724 |
| 4,298,985 | 11/1981 | Ballard et al. | 375/82 |

Primary Examiner—David H. Malzahn
Attorney, Agent, or Firm—Louis Etlinger; Stanton D. Weinstein

[57] ABSTRACT

A receiver employs fast-Fourier-transform modules to process the received signals in the frequency domain. It samples the input signal at a high sampling rate to cover a broad input bandwidth, but it transforms the sampled input signals in short segments, segments that cover time durations considerably shorter than the duration of the impulse response of the receiver's tuner filter. The transform of the sampled input signal is multiplied by a Gaussian transfer function to reduce the amount of information contained in the signal, and the values of the resultant frequency-domain sequence are reordered in such a manner as to correspond to resampling in the time domain at a slower rate. This results in coverage of the time duration of an input segment by a relatively small number of samples. The results of several input segments are concatenated to generate a filtered time-domain sequence that covers a real-time period long enough to provide an adequate tuner-filter signal history but consists of relatively few points and so requires only a short time for Fourier transformation. This longer-duration signal is transformed back to the frequency domain, where it is multiplied by the receiver transfer function and then inverse transformed to produce the receiver output.

12 Claims, 3 Drawing Figures

METHOD AND APPARATUS FOR DIGITAL FILTERING

BACKGROUND OF THE INVENTION

The present invention is directed to a radio receiver in which the analog received signal is converted into digital form and digitally processed. It is especially applicable to devices in which several tuners share common digital circuitry, although the present invention can be applied in principle to single-tuner circuits.

There are presently available analog-to-digital converters that are fast enough to sample the instantaneous values of signals having frequency components in the range of several megahertz. Additionally, there are circuits available for operating on the resultant strings of digital values to generate discrete Fourier transforms and inverse discrete Fourier transforms in real time. By combining such available circuits with appropriate high-speed gating, buffering, and arithmetic circuits, it is feasible to construct systems in which the filtering, demodulation, and other functions carried out by conventional analog tuners can be performed digitally. Such digital systems are not yet economically competitive with low-cost analog radios of the type usually used for consumer reception of standard broadcast bands. However, their characteristics make them desirable for high-performance scanning receivers or other receivers that monitor numerous signals simultaneously.

Specifically, it is possible, after an initial analog filtering that restricts the input signal to a selected range of frequencies, to sample the input signal at a rate high enough to extract all the information carried within that range of frequencies. For instance, if the band of interest is between 35 and 40 MHz, i.e., 5 MHz wide, the sampling rate must be at least 10 MHz. The resultant string of digital values is broken into segments, which are processed to produce the discrete Fourier transform of each segment. Tuner filtering is performed by multiplying the values of the transform by corresponding values of a transfer function that permits retention of only the information that falls within the narrow band representing a given tuner. Because the same transformed input segment can be multiplied by several different transfer functions separately, each representing a separate tuner, digital processing lends itself to implementation of multiple tuners sharing common circuitry.

The values resulting from multiplication by the transfer function are processed by the transform circuitry to convert them back to the time domain. This time-domain sequence, after removal of certain invalid values, is equivalent to a sampled segment of the intended tuner's response to the input signal. It is concatenated with signals from previous segments to generate the complete sampled tuner output.

One problem with such an arrangement is that, for reasonably wide input bands, the computational requirements are truly prodigious. As was noted above, the sampling rate for a 5-MHz-wide input band is 10 MHz. Since the number of computations required for generation of a transform with fast-Fourier-transform (FFT) techniques increases as N log N, where N is the number of samples in a segment, it is desirable to keep the segments from being too long, even though longer segment lengths reduce the frequency with which the transformations must be performed.

However, it is a result of the tuner-filter transfer function that making the segments too small increases the computational requirements of the system, too. This fact can best be appreciated when it is realized that filters generally have "memories"; that is, the output from a filter depends not only on its current input but also on past inputs. In the case of a reasonably good finite-impulse-response (FIR) bandpass filter having a bandwidth of 3 kHz, for example, the output depends on the values of the input over at least the preceding 3 msecs. With such a filter, it is necessary, in order to generate an output segment from, say, $t=\emptyset$ to $t=6$ msec, to operate on an input segment that includes samples not only from $t=\emptyset$ to $t=6$ msec but also from $t=-3$ msec to $t=\emptyset$. The input segments thus must overlap each other by 3 msec.

This overlap adds to the computational burden without reducing the frequency at which the input transformations must be performed. That is, if the FFT module operates on the 9-msec interval from $t=0$ to $t=6$ msec, the transformations must be performed every 6 msec, not every 9 msec. Thus, as the length of the input segments is reduced toward 3 msec, the time required for each transformation is reduced somewhat, but the frequency with which the transformations must be performed increases dramatically. A reduction in segment length from 3.2 msec to 3.1 msec, for instance, makes little change in the time required for each transformation but doubles the frequency with which those transformations must be performed. For a good 3-kHz-wide filter, therefore, the overall duration of each input segment should be well above 3 msec. If the sampling rate is 10 MHz, the size of each segment must be considerably in excess of thirty thousand samples.

For the parameters mentioned in the foregoing illustration, there are FFT modules that can transform segments of such length in real time, but it would be beneficial to reduce the computation time required of such a module so that it could perform functions in addition to transformation of the input signal. For instance, a single FFT module could be used to calculate the inverse transform of several different filtered signals concurrently if enough time were available. Furthermore, the additional time might be used by the FFT module in performing a spectrum-scanning function in order to determine the frequencies to which the receiver should be tuned.

In addition to the time constraints, the large computational burden imposes a high hardware cost; the amount of memory required by the input-segment size mentioned above makes a system implementing even a single receiver large and expensive.

One way to decrease the computation time and thus free the FFT module for inverse transformation in several tuners is to reduce the input sampling rate, but this can only be done at the expense of narrowing the input band.

It is accordingly an object of the present invention to reduce the computation time required in such digital systems without reducing the input bandwidth or the impulse-response duration of the output filter.

SUMMARY OF THE INVENTION

The present invention achieves the foregoing and other objects by operating on the transform of an input-signal segment, prior to application of the tuner filter, in such a manner as to pre-filter out much of the information that falls outside of the frequency band of the tuner filter. I accomplish this pre-filter function by multiplying the values in the frequency-domain transform of the input-signal segment by values in the transfer function of what I call a "roofing filter." The roofing filter has a pass band narrower than the bandwidth of the input signal. However, it has a bandwidth wider than that of the tuner filter, and it typically also has a transfer function more gradual in shape, so its impulse response is much shorter in duration than that of the tuner filter. As a result, it does not require nearly so long an input segment as does the tuner filter, and the initial transformation operation takes much less time than it would if the input segment were required to be longer than the impulse response of the tuner filter.

From the results of the multiplication by the roofing function, I generate the time-domain sequence that would result from resampling the time-domain output of the roofing filter at a rate that is lower than the input sampling rate but high enough to recover the information remaining after application of the roofing filter. Although wider than the pass band of the tuner filter, the pass band of the roofing filter is considerably narrower than the input band, so the number of time-domain samples that remain after the resampling is only a fraction of the number of samples in the input-record segment.

This resampled time-domain sequence is concatenated with the results of similar operations on previous input-signal segments to generate an extended time-domain segment. The extended segment covers a length of time greater than the duration of the impulse response of the tuner filter, but it contains only a fraction of the samples contained in a portion of the input signal of equal duration. Therefore, when it is transformed back into the frequency domain for application of the tuner filter, the transformation can be performed much more quickly than it could be if the time-domain sequence had as many samples as a portion of the input sequence of equal duration. The present invention thus reduces computation time greatly.

In the preferred embodiment of the present invention, I achieve a further reduction in computation time. This reduction is achieved by performing the resampling in the frequency domain. The multiplication by the roofing filter results in values of zero throughout most of the input band; all of the information remaining after the multiplication lies in the relatively few transform values at frequencies within the roofing-filter band. By applying only these few remaining values to the transform module, the time required for the transformation is greatly reduced, and the number of time-domain values produced by the transformation is reduced in the process to only the number required to carry the remaining information; i.e., the resampling results from dropping the frequency-domain samples outside the roofing-filter pass band.

However, this procedure can result in an incorrect time-domain sequence if a harmonic of the resampling frequency falls within the pass band of the roofing filter. Therefore, before the inverse transformation, I circularly shift the remaining frequency-domain values in a manner described below, and the adverse effect is eliminated.

BRIEF DESCRIPTION OF THE DRAWINGS

These and further features and advantages of the present invention are described in connection with the accompanying drawings, in which.

DESCRIPTION OF THE PREFERRED EMBODIMENTS

Figure 1:
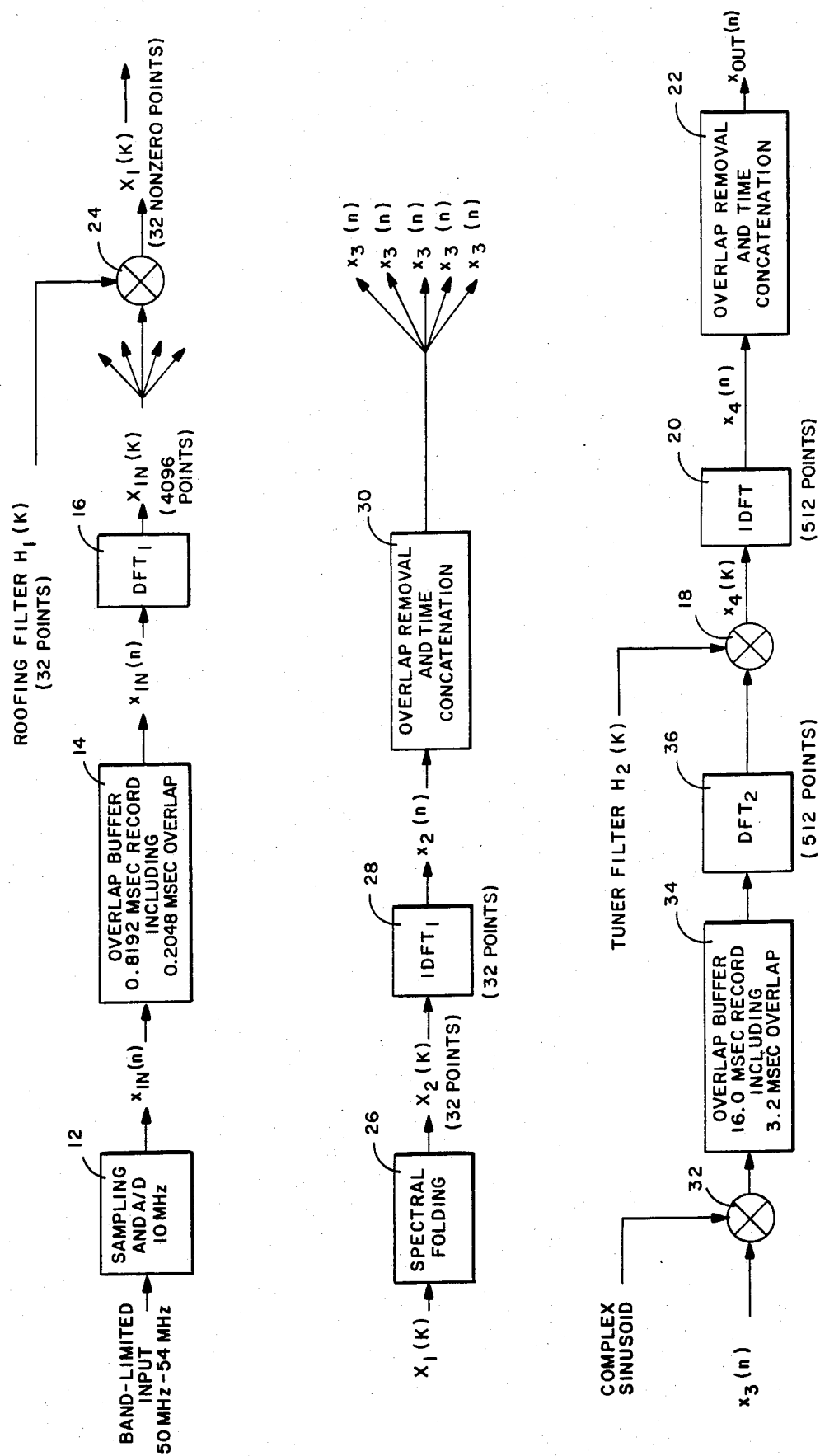
FIG. 1 is a block diagram of the steps performed by the apparatus of the present invention.

The functions performed by one embodiment of the present invention are depicted in FIG. 1. Certain of the modules used in the apparatus perform several of the steps. In particular, all of the Fourier transformations as well as the inverse Fourier transformations can advantageously be carried out by the same fast-Fourier-transform (FFT) module. It will become apparent that the present invention can be practiced by employing more than one FFT module, but the present invention makes it more feasible to implement a number of simultaneously operating receivers with a single FFT module even if the input band is relatively wide.

Briefly, the initial steps and the final steps depicted in FIG. 1 are similar to those of methods previously suggested for digital receivers. A sampling circuit and a fast analog-to-digital converter perform the step represented by block 12, which is that of sampling a band-limited signal and converting the samples to a digital form. Blocks 14 and 16 represent the steps that are required to convert the digital samples of the input signal into the corresponding discrete Fourier transform.

At this point in previously suggested methods, steps 18, 20, and 22 depicted at the end of the diagram are performed. Multiplication symbol 18 represents multiplication of the input Fourier transform point-by-point by a transfer function $H_2(K)$, which represents the narrow-band filtering performed by a tuner. The pass band of the tuner is much narrower than the input band. Block 20 represents inverse transformation to convert the resultant filtered signal to the time domain, and block 22 represents concatenation of successive segments of the signal.

Between these steps at the beginning and the end of the diagram are depicted the operations that, according to the present invention, greatly reduce the amount of computation involved in digital implementation of a tuner. In brief, these steps include multiplying, as multiplier symbol 24 indicates, the discrete Fourier transform of the input signal by a transfer function representing a "roofing filter," whose bandwidth is narrower than that of the input band but broader than the bandwidth of the tuner to be implemented. A "spectral folding" operation represented by block 26 reorders a small group of points in the output of the multiplication. As will be explained in detail below, the inverse transformation of the reordered points, which is represented by block 28, yields the input signal filtered in accordance with the roofing function but sampled at a rate much lower than the input sampling rate.

A tuner can be implemented according to the present invention even though input segments are used that are much shorter in time duration than the impulse response of the tuner filter, and block 30 represents the time concatenation of the results of several of these segments to generate a segment that is longer than the tuner-filter impulse response. Because of the efficiency of the illustrated system, the result of the concatenation represented by block 30 can be used by a single FFT module to realize several tuners simultaneously. The output of the concatenation process for a given tuner may be multiplied by a complex sinusoid, as symbol 32 indicates, to translate the signal in frequency to a desired range. The results of that multiplication are accumulated in an overlap buffer and processed by an FFT module, as blocks 34 and 36 indicate, to convert the concatenated time signal to the frequency domain. Further processing continues in the manner described above in connection with steps 18, 20, and 22.

Although the flow diagram for the method of the present invention is considerably more complicated than a flow diagram for the straightforward prior-art method, the depicted method actually is considerably faster because the initial transformation represented by block 16 can be performed on a segment consisting of a fraction of the number of points required for a single segment in the prior-art method. The final inverse transformation represented by block 20 is also performed on much fewer points. Since the number of computations required to transform a single segment of N points increases as N log N, the reduction in the number of points in an individual segment reduces the amount of computation required in most practical applications, even though a reduction in the size of the segment requires an increase in the number of segments. This reduction in computation time is described in more detail in the discussion that follows.

For the sake of example, we will assume that an embodiment of the present invention is used for a number of tuners within the broad frequency band between 50 MHz and 54 MHz. An analog filter limits the received signal to this 50-MHz-to-54-MHz range, and the signal is sampled, as block 12 indicates, at a 10 MHz rate, i.e., just above the Nyquist rate. The samples are converted into digital representations and stored in an overlap buffer, as block 14 indicates. The overlap buffer stores the samples in segments that are 8192 samples long. That is, at a 10 MHz rate, they span a time of 819.2 microseconds. Although the segments are 819.2 microseconds long, new segments are actually begun once every 614.4 microseconds; that is, the samples in the first 204.8 microseconds of a given segment are the same as those in the last 204.8 microseconds of the previous segment. The reason for this is that each segment is used for generating a roofing-filter output corresponding to only the last 614.4 microseconds of the time interval that it covers. The initial 204.8 microseconds are used as a "history" for the roofing filter. This will be explained in more detail in connection with the overlap-removal step represented by block 30.

The 8192 real time-domain points of an input segment are processed by the fast-Fourier-transform module, which treats them as 4096 complex points to produce the 4096 non-redundant frequency-domain points depicted in the diagram as $X_{in}(K)$. $X_{in}(K)$ is multiplied by $H_1(K)$, which is the discrete transfer function of a finite-duration-impulse-response (FIR) bandpass filter of intermediate bandwidth. Both the transfer function and the impulse response of this roofing filter should be gentle in shape so that the duration of its impulse response and the width of its frequency band are both moderate. Such a function may, for instance, be Gaussian. In the illustrated example, the duration of the time-domain Gaussian function (the impulse response of the roofing filter) is 204 microseconds, or just under the value of the overlap introduced by the overlap buffer. In the frequency domain, the nonzero-value bandwidth is around 39 kHz in a sixteen-bit fixed-point system. (With greater dynamic range, a wider nonzero-value bandwidth for a given Gaussian impulse-response duration results.)

With a 39-kHz bandwidth, all but thirty-two adjacent $H_1(K)$s are zero, so the multiplication of the roofing-filter function by the discrete Fourier transform $X_{in}(K)$ results in only thirty-two non-zero points in the function represented in the drawing as $X_1(K)$.

The diagram shows the $X_{in}(K)$s branching before the multiplication by the roofing filter. This is to indicate that the same frequency-domain representation of the input segment will typically be processed by more than one roofing filter, each roofing filter being centered at a different frequency and associated with one or more different tuners.

Before proceeding to the discussion of the spectral folding represented by block 26, it will be helpful to review the meaning of the function $X_1(K)$ that results from the multiplication of the roofing function by the discrete Fourier transform of the sampled input signal. The limited number of values of the discrete Fourier transform $X_{in}(K)$ covers only a limited frequency band explicitly. Also, it is generated from samples covering a limited extent in time. Furthermore, the values of both the sample train and the discrete Fourier transform of the sample train are interpreted mathematically as trains of impulses. The result is that the discrete Fourier transform contains information concerning the spectral density of the signal within a frequency band, but the discrete-Fourier-transform values do not themselves indicate where in the frequency domain the band may be. Similarly, the sample train shows the shape of the signal at points in time throughout a given segment, but there is no inherent information in the pulse train concerning where in time the segment occurred. Instead, a discrete Fourier transform pair is interpreted mathematically as a train of impulses that is periodic in the time domain with a period equal to the segment length and periodic in the frequency domain with a period equal to the sampling rate.

The multiplication represented by symbol 24 occurs in the frequency domain. Its equivalent in the time domain is the convolution of the 8192 real sample points (4096 complex sample points) in the input segment with $h_1(n)$, i.e., with the inverse transform of $H_1(K)$. The function $h_1(n)$ is a time-domain impulse train in which the impulses occur at the input sampling rate and have an envelope in the shape of a sinusoid modulated by a Gaussian wave that repeats with a period equal to the input segment length. The result of this convolution would be 4096 complex points in the time domain that actually carry no more information than the thirty-two non-zero points of the corresponding frequency-domain function $X_1(K)$. For the amount of information that it carries, the time-domain signal corresponding to $H_1(K)$ is thus vastly oversampled.

To eliminate this oversampling, one could transform into the time domain the 4096 points resulting from multiplication 24 and then resample by discarding all but every 128th point—i.e., by retaining only thirty-two time-domain points. This would be enough points to contain all of the information remaining after application of the roofing filter. Such a step would be consistent with the principles of the present invention and would afford the advantage of its broader aspects. However, it would include a time-consuming 4096-point transformation, which I avoid by effecting the time-domain resampling through frequency-domain manipulation.

The first step in the frequency-domain manipulation is to discard all but the thirty-two non-zero frequency-domain values. (Actually, it is not strictly necessary to discard all nonzero values or only nonzero values. In particular, in a system, such as a floating-point system, with greater dynamic range, it would be more typical to discard all values resulting from multiplication by $H_1(K)$ values that are less than a predetermined minimum. Most of the information remaining after application of the roofing filter would still be retained.) The resultant thirty-two-value transform, however, is not in general the transform of the resampled time-domain sequence of thirty-two points. The desired transform is obtained by a simple circular reordering. This reordering is the spectral-folding step represented by block 26.

It can be seen that a simple reordering can result in the desired transform when it is recognized that taking every 128th sample is equivalent to multiplying the inverse discrete Fourier transform of $X_1(K)$ by a train of impulses that occur on every 128th sample. Multiplication in the time domain is equivalent to convolution in the frequency domain, so taking every 128th sample is the same as convolving $X_1(K)$ with a train of impulses in the frequency domain that occur every 39.0625 Hz. The frequency-domain pulses are spaced by at least the bandwidth spanned by the (in this example, thirty-two) non-discarded points. Therefore, for a given delay in the convolution operation, at most one pulse in the 39.0625-kHz train coincides with a non-zero value of $X_1(K)$. The effect of this convolution is thus to reorder the $X_1(K)$s by reindexing them, modulo 32, where thirty-two is the number of frequency intervals in the discrete Fourier transform that add up to 39.0625 kHz. The spectral-folding step is this modulo-32 reordering.

Thus, the effect of discarding the zero values and then spectrally folding the remaining values is to resample at a rate much lower than the input sampling rate but high enough to extract substantially all the information remaining after the processing by the roofing filter. The resultant transform $X_2(K)$ consists of only thirty-two points, a transform size that is quickly transformed in the inverse discrete Fourier transformation represented by block 28.

It should be recognized at this point that spectral folding, although usually involving reordering of the $X_1(K)$s, can in some cases consist of leaving them in their original order. This happens if the transfer function $H_1(K)$ falls entirely between harmonics of the resampling frequency. In such a case, the difference between $X_1(K)$ and $X_2(K)$ is simply that $X_2(K)$ does not include the zero values outside of the band of $H_1(K)$.

The result of the inverse transformation represented by block 28 is a time-domain train of values consisting of thirty-two points $x_2(n)$. Due to the duration of the inverse transform of $H_1(K)$, however, the first eight values must be discarded because they are generated on the basis of an inadequate signal history and are thus invalid. Furthermore, because of segment overlap, they cover the same points in time as those represented—validly—by the last eight values generated from the previous segment, so the first eight points would have to be discarded even if they were valid.

The remaining twenty-four points are concatenated with the results of previous input segments to produce an extended segment $x_3(n)$. The segment $x_3(n)$ is processed by at least one, and possibly several, tuner operations for implementing tuners centered at frequencies within the range of the roofing filter.

In a given tuner operation, the complex values $x_3(n)$ resulting from the concatenation may then be multiplied by a complex sinusoid, as multiplier symbol 32 indicates, to translate the signal in frequency, typically to a baseband range. Block 34 represents the storage of the $x_3(n)$ values in an overlap buffer, which supplies 512-point overlapped segments to the FFT module, as block 36 indicates, to transform the data back into the frequency domain. The frequency-domain output is multiplied, as multiplication symbol 18 indicates, by $H_2(K)$, which is a discrete transfer function of a particular tuner filter.

The result, $X_4(K)$, consists of digital values that can be processed in any one of several ways to provide an indication of the contents of the narrow frequency band defined by $H_2(K)$ For instance, in a system in which the information of interest is the spectral "signature" of the source, the $X_4(K)$ values may simply be processed to display their magnitudes on a cathode-ray tube. In the illustrated embodiment, $X_4(K)$ is inverse transformed to generate a time-domain sequence $x_4(n)$. The inverse transform of $H_2(K)$ has a duration of 3.2 msec, so the inverse-transform values representing the first 3.2 msec are based on an insufficient signal history and are thus invalid. They also cover the same time as the last 3.2 msec of the previous segment. They are therefore discarded. The remaining values are concatenated with previously generated values to provide the output sequence $x_{out}(n)$. This is the sampled receiver signal, which is then processed as desired. Typically, $X_{out}(n)$ is converted to real values, which are in turn converted to analog quantities, filtered, and applied to a speaker to generate an audio signal.

In the illustrated example, only a single level of roofing filter is employed. This is because a single roofing filter suffices to reduce the input and output segments to manageable sizes. However, with a wider input band, a narrower output band, or more-stringent constraints on the capabilities of the FFT module, it may be necessary to add a second roofing filter and a second spectral-folding operation.

More specifically, an initial roofing filter having an impulse response short enough to provide a manageable input segment at a very high sampling rate may have a bandwidth so broad that the necessary resampling rate of the spectral folding could result in too many samples in the tuner-filter segment for the FFT module to perform the tuner transformation in the time available. In such a case, $H_2(K)$ in FIG. 1 might be a second, narrower roofing filter rather than a tuner filter, and the subsequent processing would include a further spectral-folding step, further transformation, and application of a tuner filter. In principle, therefore, output filters of arbitrarily narrow bandwidths can be implemented with a reasonable amount of computation despite high input sampling rates if enough stages of roofing filters and spectral folding stages are employed.

The operation described in connection with FIG. 1 may be carried out in an apparatus of the type depicted in block-diagram form in FIG. 2. The radio-frequency signal is first band-limited by an analog filter 40. In some cases, the resultant signal may be translated in frequency by a frequency translator 42 to insure that the input band falls entirely between successive harmonics of one-half of the input sampling rate. This is a condition that is necessary in order to avoid aliasing. Such a translation is not required in the illustrated example, because the input frequency range, 50 MHz to 54 MHz, falls entirely between 50 MHz and 55 MHz.

The translated analog signal is sampled and converted to digital data in a sampling circuit and analog-to-digital converter 44, which transmits the resultant digital data to an input buffer 46. At appropriate intervals, contents of the input buffer are sent along an FFT bus 48 to an FFT module 50, which generates the discrete Fourier transform of the time-domain data that it receives on the FFT bus 48. The timing for operation of the FFT bus 48, the input buffer 46, the FFT module 50, and other elements of FIG. 2 is provided by master timing circuitry 43. For the sake of simplicity, this timing circuitry is depicted as connected only to the FFT bus 48 and the multiplier bus 58.

The data from the input buffer 46 are sent to the FFT module 50 in an overlapped manner; i.e., the initial portion of a segment sent by the input buffer 46 is identical to the final portion of the previous segment supplied to the FFT module.

The FFT module 50 produces its output at a high data rate, and a fast output buffer 52 receives the data at the high rate and then forwards the data along a bus 54 at a rate that matches the data-handling capacities of the circuitry that is to receive the data.

One of the elements that receives data from bus 54 is the frequency-domain roofing-filter buffer 56, which receives the output that results when the FFT module 50 transforms data received from the input buffer 46. That is, buffer 56 receives the $X_{in}(K)$s depicted in FIG. 1 as the output of block 16.

The $X_{in}(K)$s are transmitted by buffer 56 along a multiplier bus 58 to a multiplication circuit 60, which additionally receives the roofing-filter transfer-function values $H_1(K)$ from a coefficient store 62. The multiplication circuit multiplies the $X_{in}(K)$s by corresponding $H_1(K)$s and returns the results of the multiplications along the multiplier bus 58 to the frequency-domain roofing-filter buffer 56. This buffer 56 now contains the thirty-two non-zero points depicted as $X_1(K)$ in FIG. 1. The $X_1(K)$s are read out of the buffer 56 in a different order so that they become the $X_2(K)$s resulting from the spectral-folding step depicted by block 26 in FIG. 1. That is, the frequency-domain roofing-filter buffer 56 serves as the means for performing the spectral-folding step.

The $X_2(K)$s read out from buffer 56 are sent along the FFT bus 48 to the FFT module 50, which performs an inverse transformation on the thirty-two points to generate the $x_2(n)$s depicted in FIG. 1 as the output of the step represented by block 28. The output buffer 52 again receives the output of the FFT module, namely, the $x_2(n)$s, and forwards them along bus 54 to another buffer, time-domain roofing-filter buffer 64. Buffer 64 accumulates the $x_2(n)$s from several input segments, discarding the invalid points and concatenating the remaining points. In the step represented in FIG. 1 by multiplier symbol 32, the accumulated time-domain data are then sent along the multiplier bus 58 to the multiplication circuit 60 to be multiplied by a complex sinusoid for frequency translation. The complex-sinusoid values are obtained from the coefficient store 62. The results return on the multiplier bus the time-domain roofing-filter buffer 64, which then sends the frequency-translated time-domain data along the FFT bus 48 to the FFT module 50 for transformation back to the frequency domain, which transformation is represented by block 36 in FIG. 1.

The output buffer 52 forwards the results of this transformation to a frequency-domain tuner-filter buffer 66, which sends the frequency-domain data to the multiplication circuitry 60 for multiplication by the tuner-filter coefficients $H_2(K)$ obtained from the coefficient store 62. The results are returned to the frequency-domain tuner-filter buffer 66, which forwards them to the FFT module 50 for inverse transformation once again to the time domain as represented in FIG. 1 by block 20.

Figure 2:
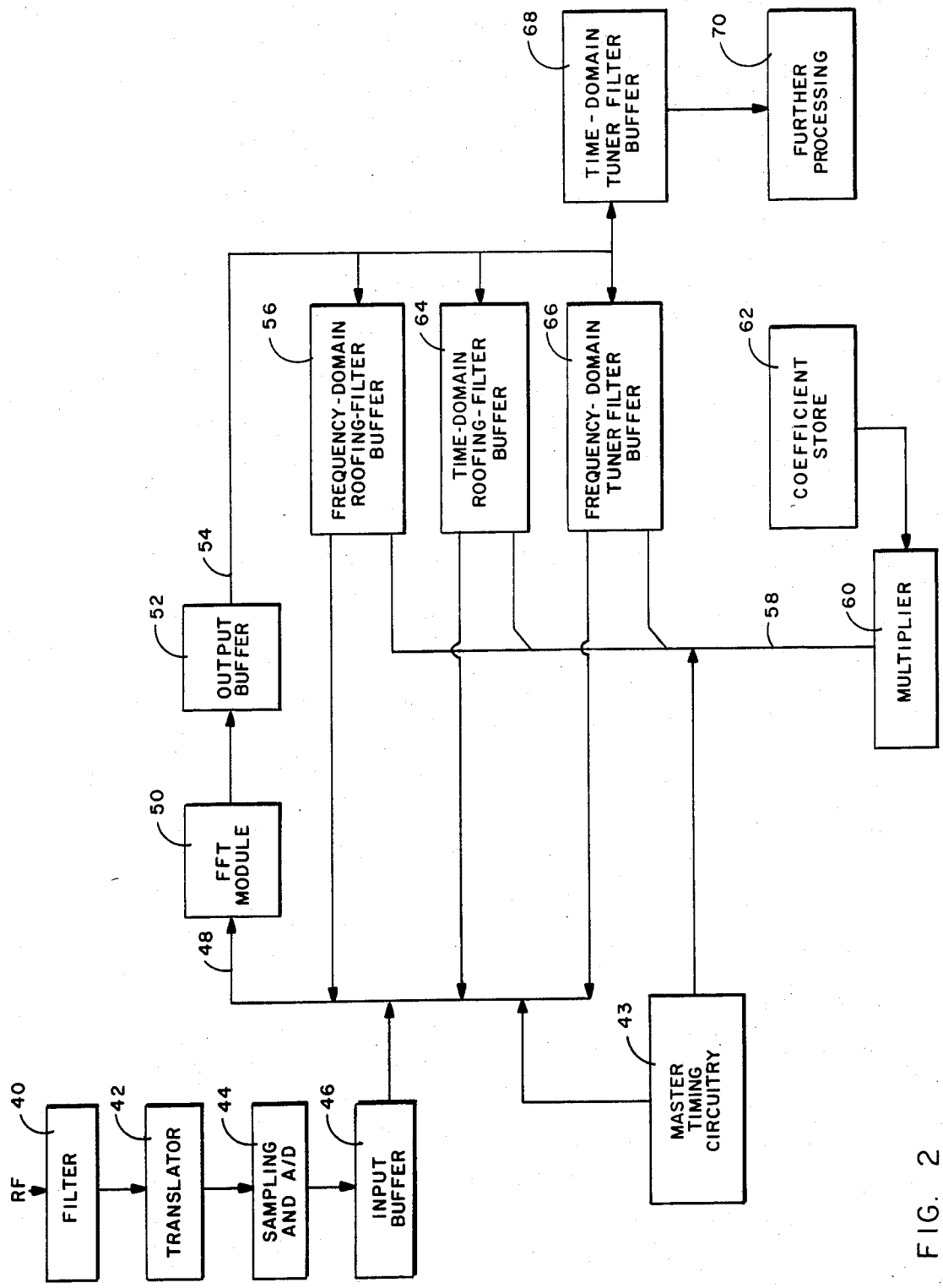
FIG. 2 is a block diagram of the apparatus itself.

The output buffer 52 forwards the resultant time-domain data to a time-domain tuner-filter buffer 68, which stores only the values after the initial overlap, thereby effecting the overlap removal represented in FIG. 2 by block 22. The time-domain tuner-filter buffer 68 also accumulates the time-domain data from successive inverse transformations and supplies them to further circuitry 70 appropriate to the particular end use for which the tuner is intended.

In light of the foregoing description, it is apparent that several of the different functions depicted in FIG. 2 are performed by a single FFT module 50. Clearly, this is not a requirement of the present invention, but it is a beneficial result in many applications, since the FFT module represents a comparatively high hardware cost.

Specifically, the one FFT module 50 performs the discrete Fourier transformation of the input segments. It also performs an inverse discrete Fourier transformation on the folded frequency-domain data. Finally, it performs a discrete Fourier transformation on the concatenated time information and the inverse transformation after the tuner-filter function has been applied.

Similarly, other parts of the circuit provide several of the functions represented in FIG. 1. The multiplication circuit 60 and the coefficient store 62 multiply the input Fourier transform by corresponding values of the frequency-domain roofing function. Additionally, they multiply the Fourier translormation of the concatenated roofing-filter output by the tuner-filter coefficients. Furthermore, since there typically are several roofing filters and several tuner filters, the multiplier circuit 60 and the coefficient store 62 can be used in implementing a relatively large number of filters concurrently.

Accordingly, although the present invention requires performance of a relatively large number of steps, it is possible for many of the steps to be provided by common hardware.

Figure 3:
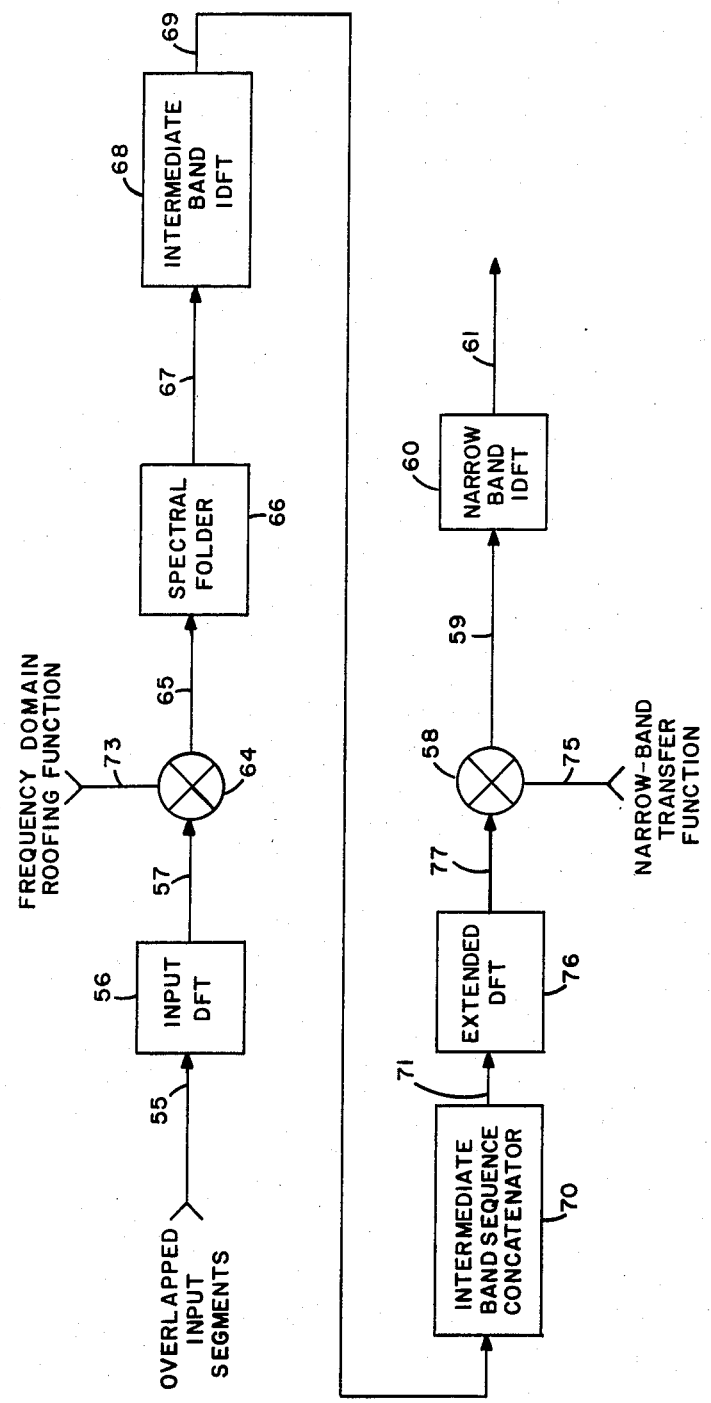
FIG. 3 is a block diagram of an alternative embodiment of the apparatus.

However, as previously stated, it is not a requirement of the present invention that steps all be performed by common hardware. FIG. 3 shows such an embodiment where each of the steps are performed by a separate apparatus. More particularly, FIG. 3 shows an apparatus for digitally implementing a narrow band filter on an input sample train representing input signals sampled at an input sampling rate, the apparatus comprising means for performing a discrete Fourier transformation 56 on each of a plurality of successive overlapped input segments 55 from the input sample train, to generate a discrete input Fourier transform 57, each input segment covering a predetermined input-segment time duration shorter than the impulse response of the narrow-band filter. Such an apparatus also comprises means for multiplying 64 the values of the input Fourier transform 57 by corresponding values of a frequency-domain roofing function 73, to generate an intermediate discrete Fourier transform 65, the frequency domain roofing function 73 including the passband of the narrow-band filter and being band limited to a roofing band whose width is less than that of the input frequency band, the inverse transform of the frequency-domain roofing function 73 having a duration shorter than that of the input segments. The apparatus also comprises means for generating 68 from the intermediate transform 65 an intermediate-band discrete time-domain sequence 69 equivalent to the result of resampling the inverse Fourier transform of the intermediate transform 65 at a resampling rate that is lower than the input sampling rate, but high enough to extract substantially all the information contained in the roofing band. The apparatus also comprises means for concatenating 70 the intermediate-band discrete time-domain sequence 69 with intermediate-band discrete time-domain sequences generated from previous input segments to produce an extended intermediate-band discrete time-domain sequence 71 that covers a time duration greater than that of the impulse response of the narrow-band filter, the extended intermediate-band sequence 71 thereby containing all of the information within the narrow band but consisting of fewer sample points than a portion of the input sample train of equal duration. Such apparatus also comprises means for performing a discrete Fourier transformation 76 on the extended intermediate-band sequence to produce an extended intermediate band transform 77. Such an apparatus finally comprises means for multiplying 58 the values of the extended intermediate-band transform 77 by corresponding values of the transfer function of the narrow band filter 75 to generate a narrow band transform 59 consisting of digital values adapted to be processed to provide an indication of the contents of the input signal within the narrow frequency band.

Such an apparatus may optionally comprise means for spectrally folding 66 the values of the intermediate transform 65 within a resampling band that is narrower than the input frequency band and includes the roofing band, the spectral folding 66 producing a folded transform 67 of the results of resampling the inverse Fourier transform of the intermediate transform at a resampling rate that is lower than the input sampling rate, but high enough to extract substantially all the information contained in the roofing band, and means for performing an inverse discrete Fourier transformation 68 on the folded function 67 and discarding the invalid values resulting from the impulse response duration of the time domain roofing function to generate an intermediate-band discrete time-domain sequence 69.

Such apparatus also may optionally comprise means for performing an inverse discrete Fourier transformation 60 on the narrow band transform 59 and discarding the invalid values resulting from the impulse response duration of the narrow band filter, said apparatus thereby producing a time domain sequence 61 that contains the information in the narrow band.

It is apparent from the foregoing discussion that the present invention greatly reduces the amount of computation required to implement a tuner. The improvement can be further appreciated by considering the constraints that would be imposed on the implementation of a tuner without the use of the present invention. The input segment would have to cover enough time to provide the necessary overlap for the receiver filter. The input segment for the input bandwidth and tuner impulse response described above would be on the order of 64K real-value points, requiring a discrete Fourier transform of 32K complex points. With some types of FFT circuitry presently available, such a computation could require the entire time interval between segments, so two fast-Fourier-transform modules could be required to implement a single tuner.

Through the use of the present invention, however, the input segments in the illustrated embodiment are only 819.2 microseconds long. A discrete Fourier transform is performed on an input segment every 614.4 microseconds, and since only 4K complex points are processed at a time the input transformation can realistically be expected to be completed with 360 microseconds by some existing FFT modules. This leaves over 250 microseconds during each input-segment time for further processing. The inverse discrete Fourier transform represented by block 28 takes very little time, since it operates on only thirty-two points. The transformations required for the tuner filter can be expected to take about 46 microseconds, but these are required only once every sixteen input-segment times.

Based on such figures, calculations show that as many as 56 tuners spread over a 5 MHz bandpass and sharing the same FFT module can be implemented by employing the teachings of the present invention. This many tuners would require optimum scheduling of the transformations. However, even with less-than-optimum scheduling—and with a sixty-four-point roofing filter instead of a thirty-two-point filter—it is realistic to expect to be able to implement, with presently available FFT circuitry, twenty tuners using 3-msec FIR filters in a receiver with a 5-MHz input band.

Clearly, the present invention greatly increases the feasibility of using FFT modules in implementing digital receivers.

What is claimed is:

1. A narrow-band filter for band limiting an input sample train representing an input signal sampled at an input sampling rate, the apparatus comprising:

A. means for performing a discrete Fourier transformation on each of a plurality of successive overlapped input segments from the input sample train to generate a discrete input Fourier transform, each input segment covering a predetermined input-segment time duration shorter than the impulse response of the narrow-band filter;

B. means for multiplying the values of the input Fourier transform by corresponding values of a frequency-domain roofing function to generate an intermediate discrete Fourier transform, the frequency-domain roofing function including the pass band of the narrow-band filter and being band limited to a roofing band whose width is less than that of the bandwidth of the input signal, the inverse transform of the frequency-domain roofing function having a duration shorter than that of the input segments;

C. means for generating from the intermediate transform an intermediate-band discrete time-domain sequence equivalent to the result of resampling the inverse Fourier transform of the intermediate transform at a resampling rate that is lower than the input sampling rate but high enough to extract substantially all the information contained in the roofing band;

D. means for concatenating the intermediate-band discrete time-domain sequence with intermediate-band discrete time-domain sequences generated from previous input segments to produce an extended intermediate-band discrete time-domain sequence that covers a time duration greater than that of the impulse response of the narrow-band filter, the extended intermediate-band sequence thereby containing all of the information within the narrow band but consisting of fewer sample points than a portion of the input sample train of equal duration;

E. means for performing a discrete Fourier transformation on the extended intermediate-band sequence to produce an extended intermediate-band transform; and F. means for multiplying the values of the extended intermediate-band transform by corresponding values of the transfer function of the narrow-band filter to generate a narrow-band transform which indicates the frequency content of the input signal within the bandwidth of the narrow-band filter.

2. An apparatus as recited in claim 1 wherein said means for generating an intermediate-band discrete time-domain sequence includes:

A. means for spectrally folding values of the intermediate transform within a resampling bank that is narrower than the input frequency band and includes the roofing band, the spectral folding producing a folded transform of the results of resampling the inverse Fourier transform of the intermediate transform at a resampling rate that is lower than the input sampling rate but high enough to extract substantially all the information contained in the roofing band; and B. means for performing an inverse discrete Fourier transformation on the folded function and discarding the invalid values resulting from the impulse-response duration of the time-domain roofing function to generate an intermediate-band discrete time-domain sequence.

3. An apparatus as recited in claim 2 further including means for performing an inverse discrete Fourier transformation on the narrow-band transform and discarding the invalid values resulting from the impulse-response duration of the narrow-band filter, said apparatus thereby producing a time-domain sequence that contains the information in the narrow band.

4. An apparatus as recited in claim 1 further including means for performing an inverse discrete Fourier transformation on the narrow-band transform and discarding the invalid values resulting from the impulse-response duration of the narrow-band filter, said apparatus thereby producing a time-domain sequence that contains the information in the narrow band.

5. A method of digitally extracting from an input signal limited to an input frequency band the information therein contained within a narrower frequency band defined by a narrow-band transfer function, the method comprising the steps of:

A. sampling the input signal at an input sampling rate high enough to extract all information contained in the input frequency band, thereby producing an input sample train;

B. performing a discrete Fourier transformation on an input segment from the input sample train to generate a discrete input Fourier transform, the input segment covering a predetermined input-segment time duration shorter than that of the inverse discrete Fourier transform of the narrow-band transfer function;

C. multiplying the values of the input Fourier transform by corresponding values of a frequency-domain roofing function to generate an intermediate discrete Fourier transform, the frequency-domain roofing function being band limited to a roofing band whose width is less than that of the input frequency band, the inverse transform of the frequency-domain roofing function being a time-domain roofing function having a duration shorter than that of the input segment;

D. generating from the intermediate transform an intermediate-band discrete time-domain sequence equivalent to the result of resampling the inverse Fourier transform of the intermediate transform at a resampling rate that is lower than the input sampling rate but high enough to extract substantially all the information contained in the roofing band;

E. performing steps A-D repeatedly and concatenating the resultant intermediate-band discrete time-domain sequences to produce an extended intermediate-band sequence that covers a time duration greater than that of the inverse discrete Fourier transform of the narrow-band transfer function, the extended intermediate-band sequence thereby containing all of the information within the narrow band but consisting of fewer sample points than a portion of the input sample train of equal time duration;

F. performing a discrete Fourier transformation on the extended intermediate-band sequence to produce an extended intermediate-band transform; and G. multiplying the values of the extended intermediate-band transform by corresponding values of the narrow-band transfer function to generate a narrow-band transform which indicates the frequency content of the input signal within the narrower frequency band.

6. A method as recited in claim 5 wherein the step of generating an intermediate-band discrete time-domain sequence includes:

A. spectrally folding values of the intermediate transform within a resampling band that is narrower than the input frequency band and includes the roofing band, the spectral folding producing a folded transform of the results of resampling the inverse Fourier transform of the intermediate transform at a resampling rate that is lower than the input sampling rate but high enough to extract substantially all the information contained in the roofing band; and B. performing an inverse discrete Fourier transformation on the folded transform and discarding the invalid values resulting from the duration of the time-domain roofing function to generate an intermediate-band discrete time-domain sequence.

7. A method as recited in claim 6 further including the step of performing an inverse discrete Fourier transformation on the narrow-band transform and discarding the invalid values resulting from the impulse-response duration of the inverse discrete Fourier transform of the narrow-band transfer function.

8. A method as recited in claim 5 further including the step of performing an inverse discrete Fourier transformation on the narrow-band transform and discarding the invalid values resulting from the impulse-response duration of the inverse discrete Fourier transform of the narrow-band transfer function.

9. A digital filter for operating on a digital input signal to provide as an output a filtered digital input signal, comprising:

A. an input buffer, adapted to receive the digital input signal, which generates a buffered input signal;

B. a data bus, adapted to receive the buffered input signal, a frequency domain roofing signal, a time domain roofing signal and a frequency domain tuner signal, and, responsive to a control signal, selects one of the buffered input signal, the frequency domain roofing signal, the time domain roofing signal or the frequency domain tuner signal as a data bus output signal;

C. a timing circuit for outputting the control signal and a multiplier control signal;

D. means for performing a discrete Fourier transform, adapted to receive the data bus output signal, for generating a discrete Fourier transform output signal;

E. a frequency domain roofing filter buffer, adapted to receive the discrete Fourier transform output signal and a multiplier output signal, which generates a first multiplier signal and the frequency domain roofing signal;

F. a multiplier, adapted to receive a coefficient signal, the first multiplier signal, a second multiplier signal and a third multiplier signal, and, responsive to the multiplier control signal selects one of the first, second or third multiplier signals to be a selected signal, and multiplies the selected signal by the coefficient signal, thereby generating the multiplier output signal;

G. a coefficient store for generating the coefficient signal;

H. a time domain roofing filter buffer, adapted to receive the discrete Fourier transform output signal and the multiplier output signal, which generates the second multiplier signal and the time domain roofing signal; and I. a frequency domain tuner filter buffer, adapted to receive the discrete Fourier transform output signal and the multiplier output signal, which generates the third multiplier signal and the frequency domain tuner signal representing the filtered digital input signal.

10. An apparatus as in claim 9 wherein said discrete Fourier transform comprises an output buffer for buffering the discrete Fourier transform output signal.

11. An apparatus as in claim 9 additionally comprising:

J. a time domain tuner filter buffer adapted to receive the discrete Fourier transform output signal which generates a time domain tuner filter signal representing the filtered digital input signal.

12. An apparatus as in claim 9 wherein said frequency domain roofing filter buffer comprises means for spectral folding.

* * * * *